United States Patent [19]

Hazan et al.

[11] Patent Number: 5,345,060
[45] Date of Patent: Sep. 6, 1994

[54] IRON COMPRISING A TYPE-OF-FABRIC DETECTOR

[75] Inventors: Jean-Pierre Hazan, Sucy En Brie; Rémy Polaert, Villecresnes; Jean-Louis Nagel, Limeil Brevannes, all of France

[73] Assignee: U.S. Philips Corporation, New York, N.Y.

[21] Appl. No.: 912,923

[22] Filed: Jul. 13, 1992

[30] Foreign Application Priority Data

Jul. 19, 1991 [FR] France .................... 91 09131

[51] Int. Cl.⁵ .................. D06F 75/26; G01N 27/00
[52] U.S. Cl. .................. 219/250; 324/71.1; 324/452
[58] Field of Search .............. 38/1 C, 1 D; 219/250, 219/251; 324/71.1, 72, 452

[56] References Cited

U.S. PATENT DOCUMENTS

| | | | |
|---|---|---|---|
| 2,387,293 | 10/1945 | Preston | 38/1 C |
| 4,692,589 | 9/1987 | Borsari et al. | 219/251 |
| 4,803,342 | 2/1989 | Steers et al. | 219/257 |
| 4,910,895 | 3/1990 | Rethmeier et al. | 38/77.83 |
| 4,939,342 | 7/1990 | Frens et al. | 219/251 |
| 4,980,981 | 1/1991 | Naidoo | 38/1 C |
| 4,983,923 | 1/1991 | Taniguchi | 324/454 |
| 5,013,003 | 5/1991 | Driessen et al. | 248/117.6 |
| 5,042,179 | 8/1991 | van der Meer | 38/77.83 |
| 5,156,025 | 10/1992 | Frucco | 68/12.02 |

*Primary Examiner*—Bruce A. Reynolds
*Assistant Examiner*—Gregory L. Mills
*Attorney, Agent, or Firm*—Ernestine C. Bartlett

[57] ABSTRACT

An iron includes a heating element (97), heating control (11), for the heating element, and a control thermostat (13). To determine the type of fabric on which the iron is placed during ironing, the iron includes a type-of-fabric detector, which can be an electrostatic detector (35) or an optical detector (85). A maximum temperature limit $T_s$ defines the maximum ironing temperature of delicate fabrics. In the case of incorrect settings the operation of the iron is invalidated. The operation of the detector can be rendered dependent upon a humidity detector (60) which measures a resistivity of the fabric. The operation of these detectors (35, 85) may also depend on a detector for the state of use of the iron.

23 Claims, 6 Drawing Sheets

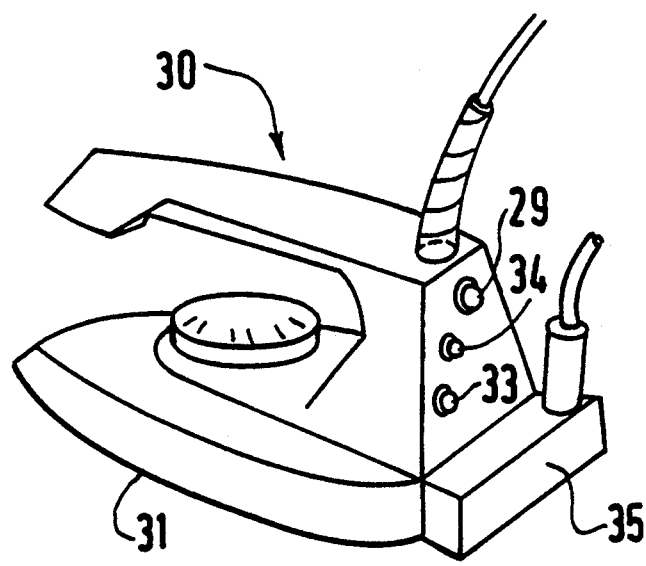
FIG. 3
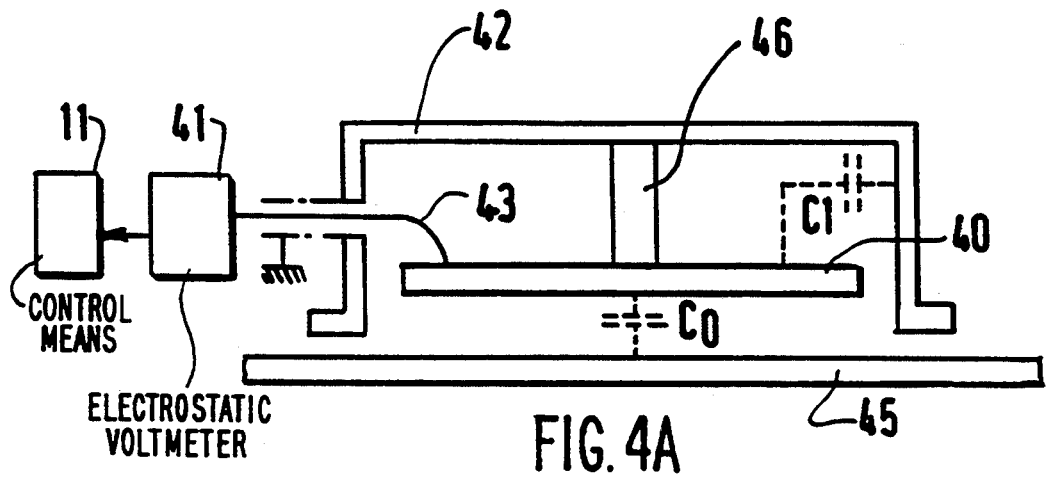
FIG. 4A
FIG. 4B
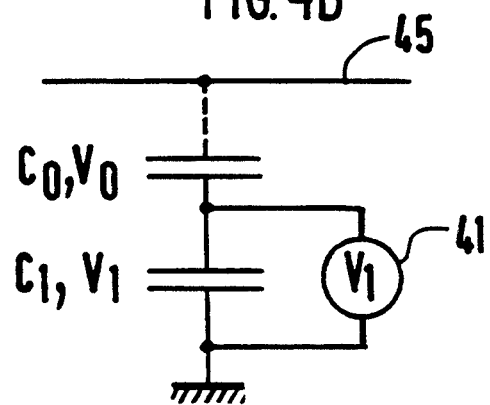

IRON COMPRISING A TYPE-OF-FABRIC DETECTOR

FIELD OF THE INVENTION

The invention relates to an iron comprising a heating element, heating-control means for the heating element, and a control thermostat.

BACKGROUND OF THE INVENTION

When fabrics are ironed the temperature settings selected by the user by means of the thermostat are not always correctly adapted to the type of the fabric being ironed.

This may concern a control error of the thermostat or failure of the user to recognize the type of the fabric being ironed. This may have serious consequences for the fabric if it is ironed at too high a temperature and, as a matter of fact, it may be damaged. The ironing problems are characterised by:
  a large variety of textiles
  a large variety of temperature conditions
  a necessity of soon enough detecting a possible control error and of rapidly responding.

Manufacturers of irons provide the irons with thermostats, leaving the decision about the setting to be chosen to discretion of the user. No control whatsoever is provided to preclude a possible error by the user.

SUMMARY OF THE INVENTION

Therefore, it is useful to have a safety device by means of which a control error can be avoided or the user can be warned that erroneous settings have been programmed.

This object is achieved by means of an iron comprising:
  a detector for detecting the type of fabric to be ironed, the detector being adapted to supply a signal (SF) to distinguish a delicate fabric (SF=1) from a non-delicate fabric (SF=0),
  means for storing a maximum temperature limit ($T_s$) corresponding to delicate fabrics, and
  comparison means for comparing the maximum temperature limit ($T_s$) with a temperature ($T_a$) programmed by means of the thermostat,
  when said signal (SF) indicates a non-delicate fabric (SF=0) the detector activating the control means to provide heating to the temperature ($T_a$), and
  when the signal (SF) indicates a delicate fabric (SF=1), the detector validating the comparison means to act upon the control means either so as to activate an alarm when the programmed temperature is equal to or higher than the maximum temperature limit ($T_a \geq T_s$) and to invalidate the heating control or to perform moderate heating, or so as to enable heating to the programmed temperature ($T_a$) when the programmed temperature is below the maximum temperature limit ($T_a < T_s$).

This has the advantage that when a critical setting for the fabric is detected the heating of the iron is automatically disabled, turned off or reduced to avoid any risk of damage to the fabric, or is disabled by the user with the aid of an appropriate button. Preferably, for even more effective action, the iron has a low thermal mass, for example so as to provide a cooling rate of approximately 7° C. per second. When the temperature setting ($T_a$) programmed by the user appears to be below the maximum temperature limit ($T_s$) no action will be taken, heating then being effected as programmed by the user.

Specifically, two situations may be envisaged.

Preferably, the DNA detector is operative beforehand and subsequently enables or does not enable the settings programmed by the user. In the case that the alarm is activated operation of the heating element with a high electric power is then inhibited. The iron can be allowed to operate at a reduced power in order to reach a temperature corresponding to delicate fabrics (for example 120° C.).

Alternatively, the iron is systematically turned on and used, the DNA detector intervening only after the event. In the case that the alarm is activated the heating of the heating element of the iron is then reduced.

The maximum temperature limit ($T_s$) can either be dictated by the construction or can be selected by the user by means of a knob.

Different types of detector can be used. Preferably, in accordance with the invention, the amount of the electrostatic charges generated at the surface of the fabric by the movement of the iron on the fabric can be measured by means of a detector of a first type. It is thus possible to determine a threshold for the amount of electrostatic charge in order to distinguish delicate fabrics from non-delicate fabrics. This may concern relative or absolute measurements.

The sensitivity of the detector can be improved advantageously in that in the proximity of the detector an element of an insulating material is arranged which generates electrostatic charges at the surface of the fabric by frictional contact with said fabric.

Depending on the degree of humidity of the fabric the threshold of the amount of electrostatic charge may not be reached. Therefore, it is necessary to determine whether the degree of humidity is at a suitable level to carry out the measurement of the amount of electric charge. If this is not the case, the degree of humidity of the fabric should first be reduced.

To determine the degree of humidity a humidity detector may be used, which detector comprises:
  means for measuring the resistivity of the fabric, and
  means for measuring an average amplitude of an electric signal resulting from resistivity variations caused by the movement of the iron on the fabric.

The means for measuring the resistivity of the fabric comprise two electrodes which are flush with the soleplate of the iron so that they can be brought into contact with the fabric. The electrical resistance between these two electrodes is measured by means of a suitable circuit. A low electrical resistance is characteristic of a damp fabric. A high electrical resistance is characteristic of a dry fabric.

To reduce the humidity the fabric is slightly heated. This can be effected either by means of the iron itself, which is systematically set to moderate heating, or by a supplementary heating element provided in the humidity detector. To reduce the humidity the user moves the iron over the fabric. This operation has no consequences for the fabric in the case of an incorrectly set thermostat because the humidity prevents the temperature of the fabric from rising critically before said measurements have been effected.

When the resistance value reaches the value for a dry fabric the measurement of the amount of electrostatic charge is validated.

It is possible to use another type of detector. Thus, the detector may comprise a heat source adapted to heat the fabric and an optical emitter/receiver assembly which determines the variations in reflectance of the fabric while the fabric is heated by said heat source. It is thus possible to determine a reflectance-variation threshold marking the boundary between delicate fabrics and non-delicate fabrics.

It is possible to improve the operational safety by determining if the iron is in use, for example if it is being moved or if the user is holding the handle. For this purpose the detection of the type of the fabric is preceded by a detection of the state of use. If the iron is not used the heating of the heating element is automatically turned off after a short delay (for example 5 to 10 s). If the iron is used the type-of-fabric detector is activated, which detector operates as described above. The detector is controlled by a detector for the state of use of the iron, which detector comprises means for supplying a signal (UT) to distinguish between use (UT=1) and non-use (UT=0), the detector being activated when the signal (UT) indicates a state of use (UT=1) and being deactivated when the signal (UT) indicates a state of non-use (UT=0), the detector activating the control means to turn off or reduce the heating when the signal (UT) indicates a state of non-use (UT=0).

BRIEF DESCRIPTION OF THE DRAWINGS

The invention will be more fully understood by means of the following drawings, which are given by way of non-limitative example and in which:

FIG. 3 is a perspective view of an example of an iron comprising a type-of-fabric detector DNA.

FIG. 4 shows two diagrams A, B of a detector DNA which operates by measuring electrostatic charges.

DESCRIPTION OF EMBODIMENTS

Figure 1:
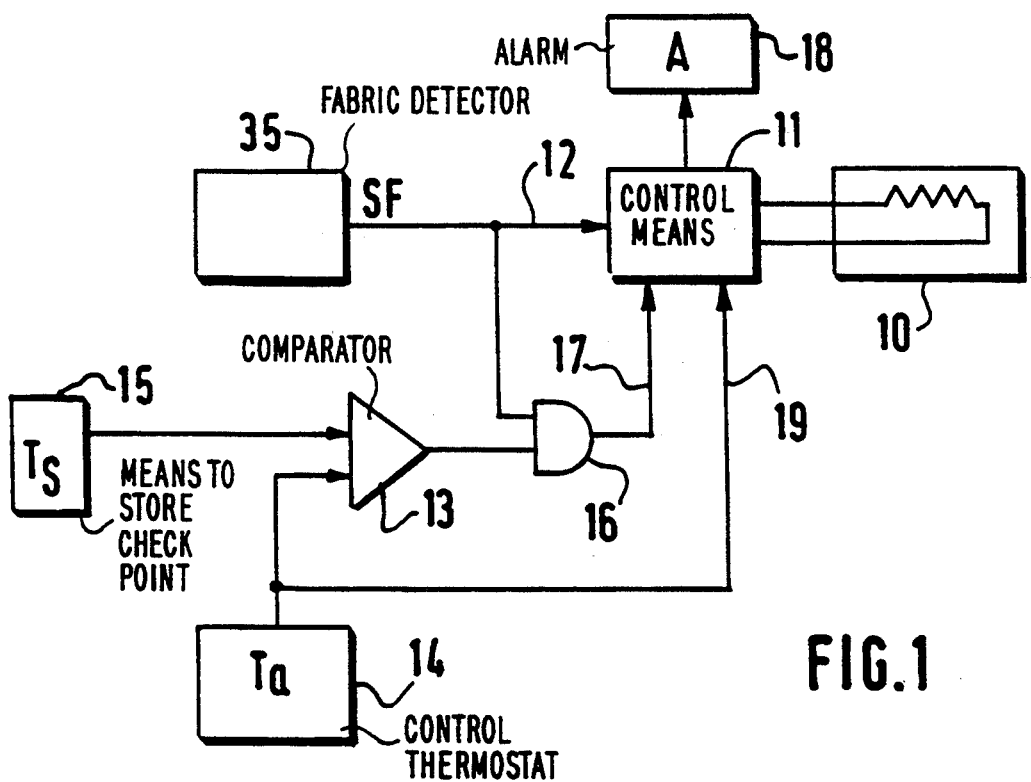
FIG. 1 is a diagram of the detection and control means of an iron embodying the invention.
Figure 2:
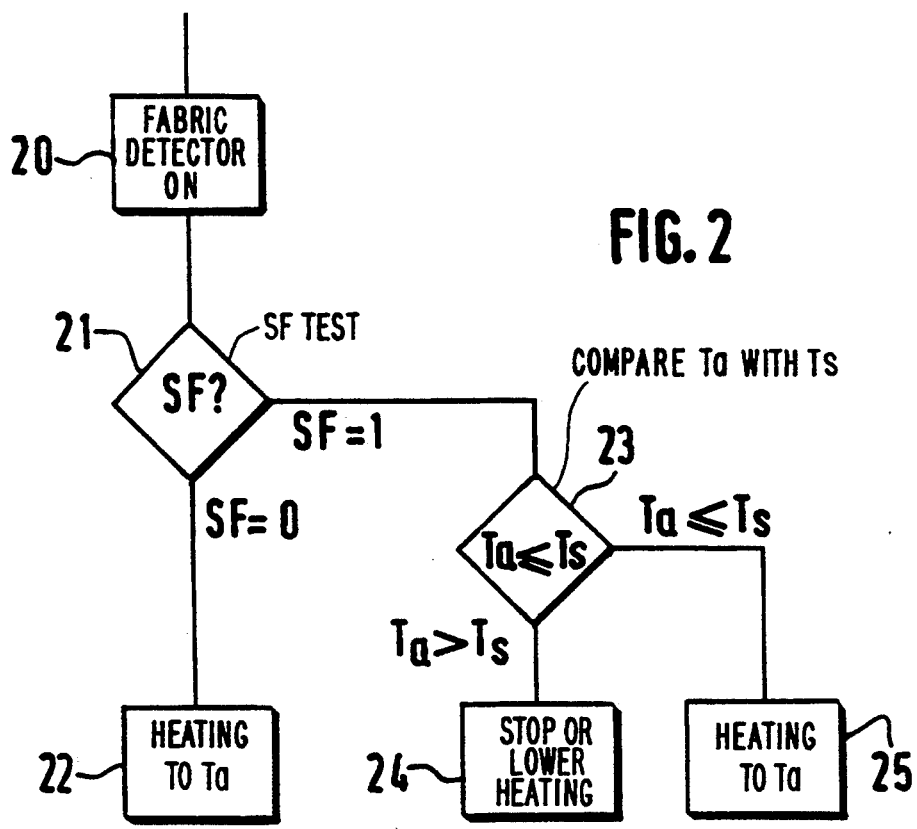
FIG. 2 is a flow chart of the principal detection and control steps.

FIG. 1 shows essential electric elements of an iron according to the invention. To operate, the heating element 10 receives an electric energy from control means 11. A detector DNA of type of fabrics to iron gives an output signal SF which distinguishes a delicate fabric (SF=1) from a non-delicate fabric (SF=0). The output of the DNA detector is directly connected (connection 12) to the control means 11. The connection 12 activates the control means 11 when SF=0 to switch on the heating element 10. Moreover, a comparator 13 compares two temperatures T and $T_s$ issued respectively from a control thermostat 14 and from memory means 15. These last can be either a stored value established during manufacturing (a fixed potential) or a control knob adjusted by the user. The comparator 13 delivers an output signal indicating whether $T_a$ is higher, equal or lower than $T_s$. When the output signal from the detector DNA detects a delicate fabric (SF=1), this signal SF=1 validates the comparator output. These functions are represented on FIG. 1 by a logic AND gate 16, but other validating means are suitable. When SF=1, the connection 12 is non-operative and the connection 17 is activated. According to the output signal from the comparator 13, the signal on the connection 17 can:

either, when $T_a > T_s$, activate the control means 11 to lower the heating put out by the heating element 10 and activate an alarm 18 or, when $T_a \leq T_s$, activate the control means 11 to allow an heating by the heating element 10 up to the programmed temperature $T_a$ (connection 19).

The type-of-fabric detector DNA is arranged in the iron in such a way that it faces the fabric when the iron is moved over the fabric. FIG. 3 shows diagrammatically an iron 30 provided with an detector DNA 35 arranged at the back of the soleplate 31 of the iron. The user can adjust the temperature $T_s$ by means of a control knob 29. A button 34 provides manual validation, allowing the user to validate the detector DNA.

In a preferred embodiment of the invention the detector DNA is an electrostatic detector which measures the electrostatic charges produced in the fabric by the movement of the iron on the fabric. FIG. 4-A shows a metal electrode 40 which is electrically connected to a high-impedance electrostatic voltmeter circuit 41. The electrode 40, which is electrically insulated by means of an insulator tube 46, is arranged in a shielding 42 in order to ensure that the measurement is not disturbed. A coaxial connection 43 may be provided between the electrode 40 and the voltmeter circuit 41. The electrode 40 is arranged in the iron so as to be situated at a small distance from the fabric 45. Thus, the amount of the electrostatic charge generated at the surface of the fabric by the movement of the soleplate of the iron can be measured capacitively by means of the electrode 40. Between the electrode 40 and the fabric 45 a capacitance $C_0$ exists. Between the electrode 40 and the shielding 42 a capacitance $C_1$ exists.

Figure 11:
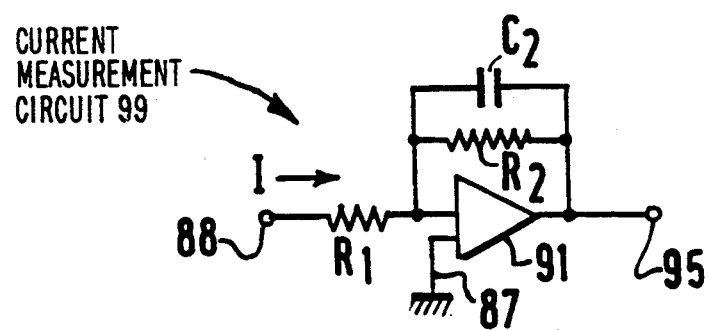
FIG. 11 is a diagram of an electrical circuit for measuring the average amplitude of an electric signal representing the electrostatic charge variations.

An electric signal I appears as a signal whose amplitude varies in the rhythm of the movement of the iron on the fabric. The electrostatic voltmeter circuit measures the average amplitudes of said signal. FIG. 11 shows an example of the electrical circuit diagram of a circuit 99 for determining the average amplitude of the signal. The circuit 99 comprises a resistor $R_1$ connected to the input terminal 88 receiving the current I. The other end of this resistor $R_1$ is connected to an input of an amplifier 91 having a high input impedance. A circuit comprising a capacitance $C_2$ and a resistance $R_2$ in parallel is arranged between the input and the output of this amplifier 91. Thus, a signal representing the average value of the amount of electrostatic charge appears on the output 95.

The capacitive bridge is shown in FIG. 4-B. By measuring the electrostatic potential $V_1$ across the capacitance $C_1$ it is possible to determine the magnitude of the electrostatic charges of the fabric. By measuring $V_1$, the values $C_0$ and $C_1$ being laid down by the construction, it is possible to determine the electrostatic character of the fabric by experiment. By way of example comparative values (expressed in arbitrary units) are given for several fabric types.

| | |
|---|---|
| Cotton | 1 to 5 |
| Viscose | 1 to 5 |
| Acetate | 15 to 20 |
| Polyester | 18 to 24 |
| Acrylic | 15 to 20 |
| Nylon | 14 to 18 |
| Wool | 18 to 24 |
| Silk | 14 to 20 |

It is to be noted that most fabrics requiring comparatively low ironing temperatures exhibit the most pronounced electrostatic character. In accordance with the invention it is thus possible to determine a threshold $Q_s$ for the amount of electrostatic charge, enabling a distinction to be made between delicate fabrics and non-delicate fabrics. Crossing of this threshold is detected by the circuit 41.

This threshold $Q_s$ can then be used for checking whether the temperature setting $T_a$ programmed by the user is in conformity with the type of fabric. If this is not the case an alarm is activated and the heating of the heating element is invalidated or reduced if the heating element has already been activated. In order to ensure an effective cooling the iron should have a low thermal mass.

However, provision can be made to allow the user to bypass this setting upon activation of the alarm by disabling the alarm by means of an appropriate knob 34 (FIG. 3). As a matter of fact, the level at which the alarm is activated is adjustable so as to obtain a high degree of safety. In certain cases a warned user can then ignore this warning.

The measurements may be absolute measurements, which require a zero-reset operation for the detector, for example by short-circuiting the detector capacitances before each measurement. By means of another knob 33 it is possible to select either a zero level or a reference level $Q_R$ for the electrostatic charges. Other arrangements are possible.

The measurements may also be relative measurements, which requires a calibration on a reference fabric. This calibration can be obtained, for example, by moving the iron on a fabric of a known type, for example cotton, the resulting electrostatic charge level being taken as the reference level $Q_R$. The user can validate the reference level $Q_R$ by actuating the push-button 33 (FIG. 3).

Figure 5:
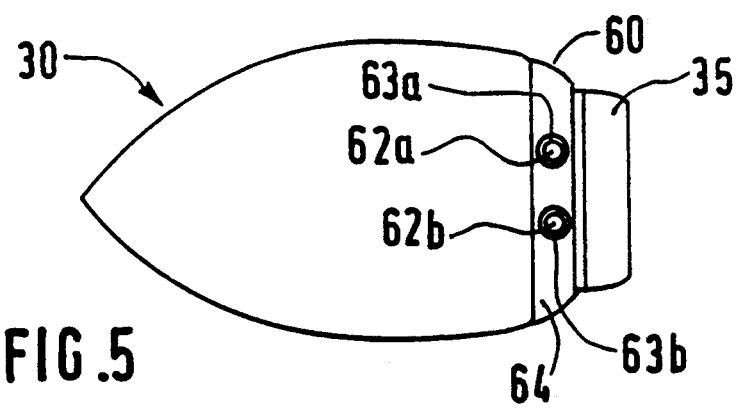
FIG. 5 is a diagrammatic underneath view of an iron provided with a humidity detector and a detector DNA.

It is possible to increase the amount of generated electrostatic charges by providing the iron with an element made of an insulating material and arranged on the iron to generate electrostatic charges by frictional contact as the iron slides on the fabric. It may be formed by, for example, a plate arranged in the proximity of the detector DNA. The plate can be made of, for example, Teflon*, glass, enamel, Kapton*.
*Trademark For a correct measurement of the amount of electrostatic charge by means of the detector DNA it may be necessary to first reduce the degree of humidity of the fabric. To determine this degree of humidity a humidity detector DHU is used, which measures the electrical resistance of the fabric between two contact electrodes. FIG. 5 is a diagrammatic underneath view of an iron 30 comprising a humidity detector 60 and a detector DNA 35. The humidity detector 60 comprises two electrodes $62_a$, $62_b$, which preferably have a rounded shape, for example hemispheric, to slide easily on the fabric. Suitable electrodes are, for example, stainless steel electrodes of 5 mm to 10 mm diameter. These electrodes may be arranged on an elastic base 64 for a good contact with the fabric without leaving any traces. A measurement circuit determines the value of the electrical resistance of the fabric between the two electrodes. If this value is low the fabric is moist. If this value is high the fabric is dry. The electrodes are accommodated in recesses $63_a$, $63_b$ formed in a plate 64.

Figure 6:
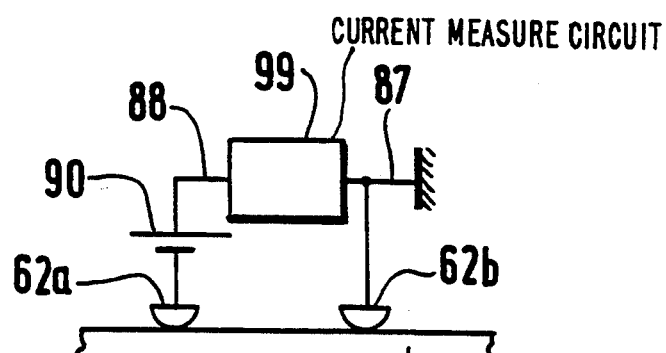
FIG. 6 is a diagram of an electrical resistivity measurement circuit.

FIG. 6 is a diagram of an electrical resistivity-measurement circuit. The electrodes $62_a$, $62_b$, which are in contact with the fabric 45, are connected to an electrical power supply 90 and to a circuit 99 for measuring the electric current I in the circuit. The circuit 99 is for example the circuit shown in FIG. 11. The other input of the current measure circuit 99 may be connected to earth. The soleplate of the iron can then take the place of the electrode $62_b$. The humidity detector then comprises an electrode $62_a$ and the soleplate 31 as the second electrode.

When the amount of generated electrostatic charges is to be increased the plate 64 can perform this function. It may be made of an electrically insulating material, for example, Teflon*, glass, enamelled sheet metal, Kapton*. The temperature resistance of the material should be adequate to enable it to be brought into contact with more or less warm fabrics without degradation of the material.
*Trademark In order to ensure that the electrostatic detector 35 can operate in various directions of movement of the iron the plate 64 may partly or wholly surround the measurement electrode 40. A suitable shape is, for example, an L-shape or a circular shape.

When the humidity detector 60 detects a humidity which is too high the iron is heated moderately while the measurement of the degree of humidity is continued. When the humidity detector detects a high resistance characteristic of a dry fabric the response to measurement of the detector DNA is the same as described hereinbefore.

To reduce the degree of humidity it is possible to heat the fabric, not by means of the heating element of the iron but by means of a supplementary heating element (small heating plate) provided in the humidity detector. This has the advantage that the two heating processes are separated, one for ironing and one for dehumidification. The mass of the supplementary heating element can then be very small. The humidity detector then operates more rapidly with a very small risk of damaging the fabric.

Figure 7:
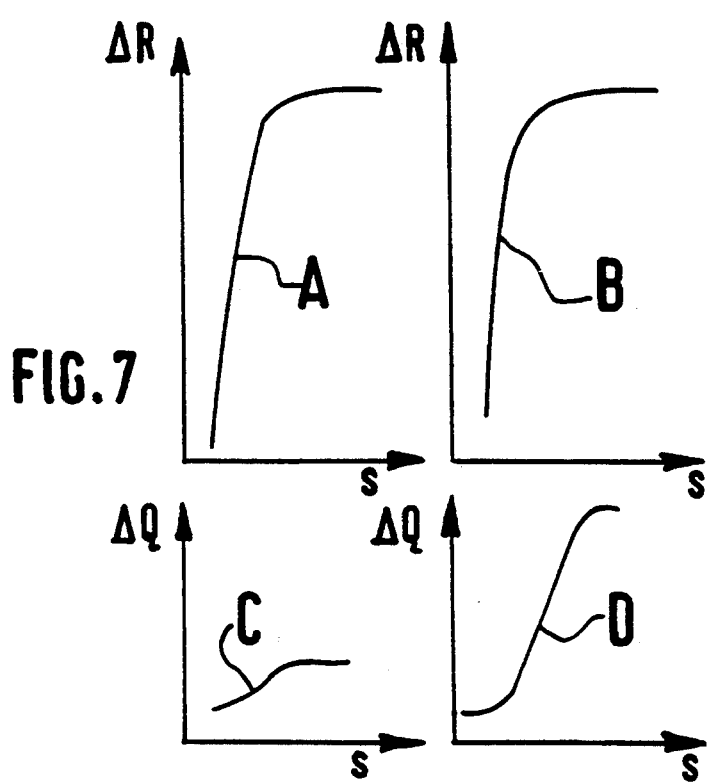
FIG. 7 shows curves representing the resistance variations DR and the variations DQ of the electrostatic charges during a drying operation.

FIG. 7 shows curves representing resistance variations DR and electrostatic-charge variations DQ during a dehumidifying operation for an iron as shown in FIG. 5. When the iron is applied and subsequently moved in the direction of its front tip with a moderately warm soleplate the humidity detector 60 will meet fabric areas which become increasingly dry (over the soleplate length of the iron). This yields curves A and C for cotton and curves B and D for acrylic fabrics as a function of the degree of drying. The curves C and D relate to the electrostatic-charge variations DQ. The curves A and B relate to the electrical-resistance variations DR. The units which are used are arbitrary. When the resistance becomes high the amount of electrostatic charge increases in relation to the type of fabric. In practice, the fabrics never have a constant humidity, which results in fluctuations of the signal as a function of the movements of the iron.

In another embodiment the detector DNA can operate by means of a measurement of the reflectance of the fabric. This method of course depends on the fabrics themselves and cannot be used in all cases. In particular black fabrics having a rippled texture may give unsatisfactory results. Nevertheless, it can be applied to many other fabrics and thereby helps the user to achieve a high degree of reliability.

Figure 8:
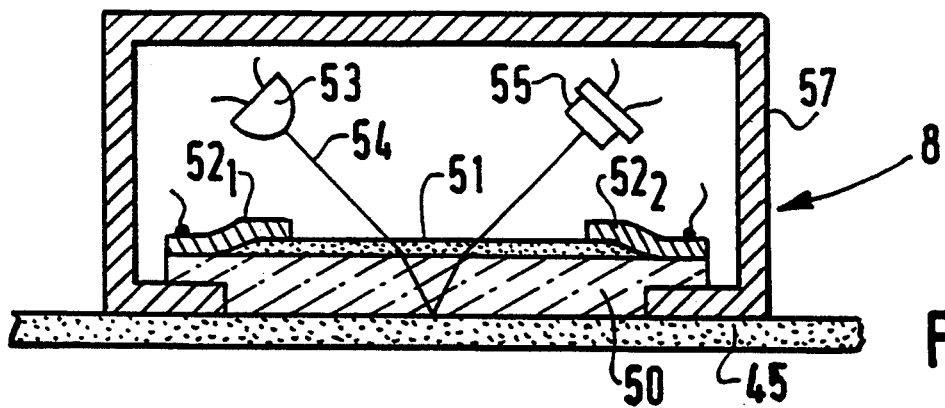
FIG. 8 is a diagram of a detector DNA which operates by reflectance measurements.

FIG. 8 shows a type-of-fabric detector DNA 85 operating by means of optical measurements. It comprises a supplementary heating element which heats a small area of the fabric to a cautiously determined temperature, the behaviour of this small area being observed by optical means.

The supplementary heating element is constituted by a substrate 50 carrying a thin film 51 of a material which is sufficiently resistive to form a heating resistance and which is also transparent to the light radiation used. The necessary electric power can be applied by means of electrical contacts $52_1$, $52_2$. The thin film 51 heats the substrate 50, which in its turn heats the fabric 45 with which it is in contact when the iron slides over the fabric. The maximum temperature attainable by the fabric is adjusted in such a way that the fabric cannot be damaged. Nevertheless, the reflectance variations of the delicate fabrics should be adequate for detection. A light emitter 53, for example a light-emitting diode, emits a light beam 54, which upon reflection from the fabric 45 is detected by the detector 55, for example a phototransistor. All these elements are accommodated in a casing 57. On the basis of the reflectance variations thus detected a variation threshold is defined above which an alarm is triggered.

To improve the operational safety of the iron it is possible to control the type-of-fabric detector DNA by means of a state-of-use detector. This is, for example, a motion detector, a detector to detect whether the handle is gripped, or an electrostatic detector. A motion detector is known, for example, from European Patent EP 0,227,150. When the electrostatic detector or the humidity detector provided in the iron are moved they supply an electric signal whose average value enables either the type of fabric or the degree of humidity to be determined. This electric signal varies in the rhythm of the ironing movement. By detecting the rising and falling edges of the signal supplied by one of said detectors these detectors can perform functions assigned to the state-of-use detector. An electrostatic detector or a humidity detector can thus be used to form a motion detector. In that case the iron further comprises means for detecting a movement of the iron by measuring a rhythm of variations of said electric signal supplied by one of the detectors. When the iron is not in use heating of the heating element is inhibited. When the iron is in use the heating of the heating element is controlled by the type-of-fabric detector DNA as described hereinbefore.

Figure 12:
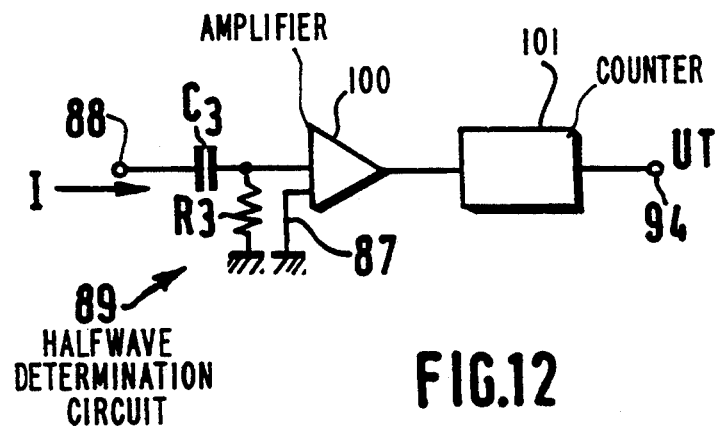
FIG. 12 shows an example of a circuit for measuring the rhythm of an electric signal.

FIG. 12 shows an example of the circuit 89 by means of which the number of halfwaves can be determined. It comprises a capacitor $C_3$ and a resistor $R_3$ connected to an input of an amplifier 100 having a high input impedance. This circuit derives the signal I and supplies pulses upon each rising and falling edge of the signal. These pulses are subsequently counted in a counter 101, which supplies a signal S on an output 94 when no or a very small number of pulses (for example 1 to 3) have appeared within the predetermined time interval.

If the iron ceases to be used, for example to replace the fabric, the heating of the heating element of the iron is automatically disabled. This allows the iron to cool rapidly before the use of the type-of-fabric detector DNA (particularly with an iron having a low thermal mass). This provides protection by the time the iron is placed on another fabric which may be a delicate fabric. When the type-of-fabric detector is of the electrostatic kind it can be set to zero by short-circuiting the signal electrode briefly to earth. This short-circuit can be effected electronically, for example when the iron is not in use.

When the state-of-use detector indicates that the user is using the iron again the signal from the state-of-use detector becomes effective after a delay of 1 to 2 seconds. This time is generally adequate to place the iron on the fabric to be ironed after it has been gripped.

Figure 9:
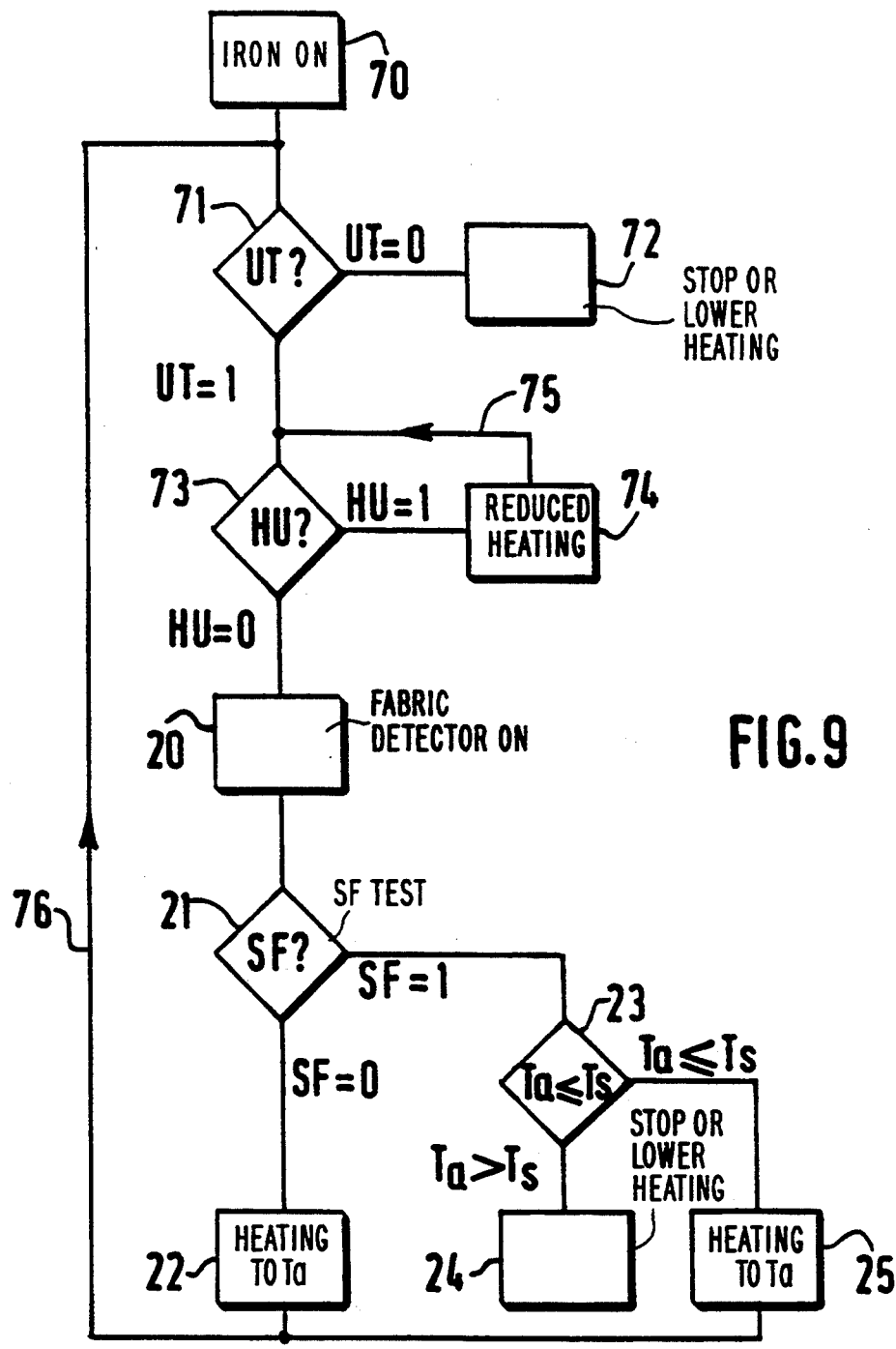
FIG. 9 is a flow chart of the principal detection and control steps in the case of a combination of a humidity detector and a state-of-use detector.

FIG. 9 shows a flow chart of the principal detection and control steps for an iron comprising a state-of-use detector, a humidity detector and a type-of-fabric detector.

Step 70: the iron is put into operation. The heating element can be controlled to obtain a programmed heating, a reduced heating or no heating.

Step 71: the state-of-use detector detects whether the iron is in use (UT=1) or not in use (UT=0). If UT=0 the iron is either turned off or set to reduced heating (step 72). Setting to reduced heating provides preheating. If UT=1 this signal validates the operation of the humidity detector. A certain delay may be provided to allow the user to place the iron onto the fabric and to ensure a correct measurement.

Step 73: the humidity detector determines whether the fabric is moist (HU =1) or dry (HU=0).

When HU=1 the iron is set to moderate heating (step 74) to dehumidify the fabric and to enable subsequent measurements. A loop 75 is traversed until the measurement indicates a dry fabric.

When HU=0 this signal validates the operation of the type-of-fabric detector DNA. This detector functions as described hereinbefore.

When the iron operates with heating to the programmed temperature $T_a$ (steps 22 and 25) a test loop 76 is traversed for steadily detecting the use of the iron. Each time that it ceases to be used within a predetermined time the iron is either turned off or set to reduced heating.

Figure 10:
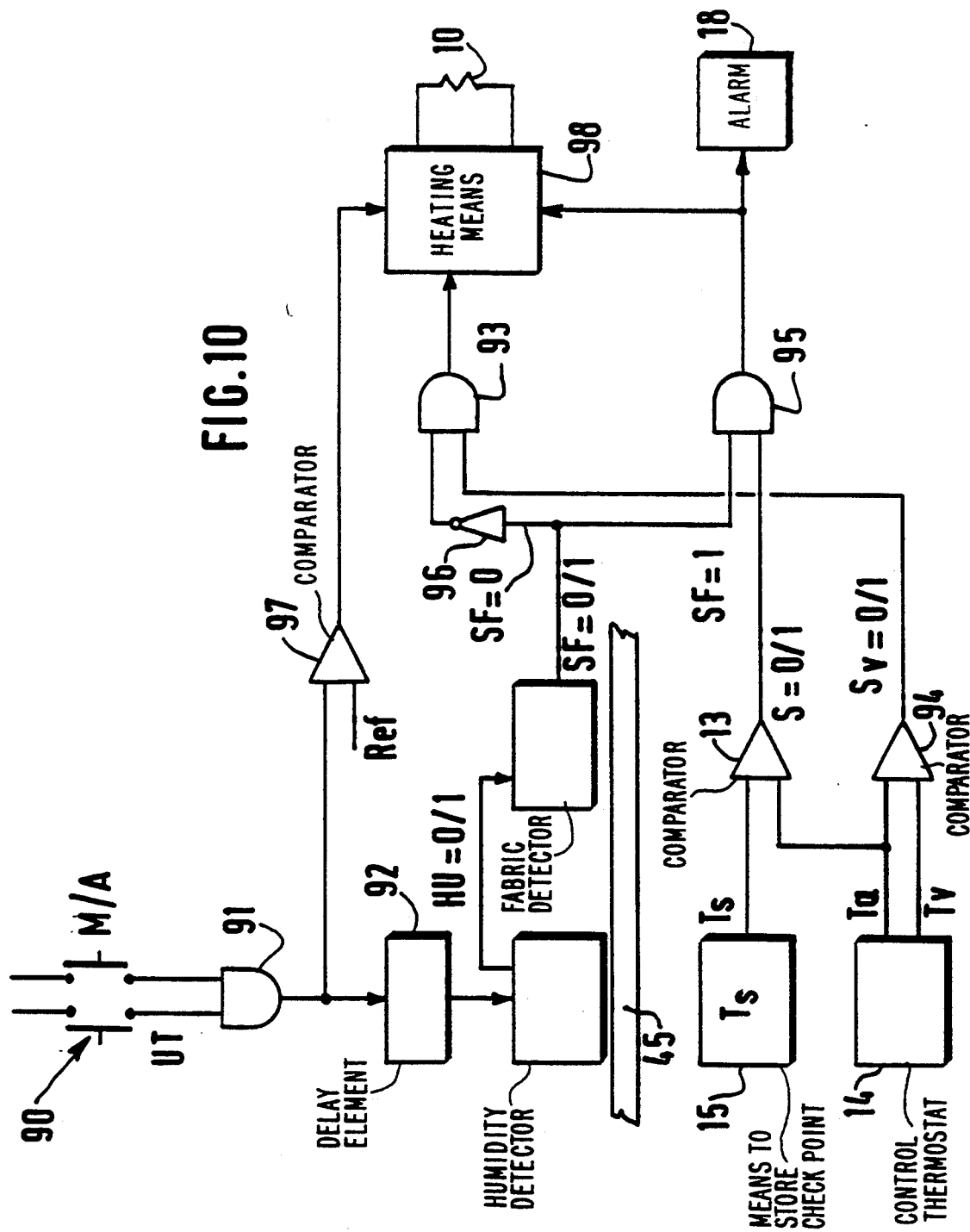
FIG. 10 is an electrical circuit diagram of the detection and control means of an iron in an embodiment comprising a state-of-use detector, a humidity detector and a type-of-fabric detector.

The information obtained from the various detectors is subsequently processed, for example as indicated in the flow chart in FIG. 10. The start-stop switch M/A and the contactor 90, which detects that the handle is held by the user, are connected to an AND gate 91. When UT=1 and M/A is activated the gate 91 actuates a delay element 92, which after a short delay (for example 1 to 2 seconds) activates the humidity detector DHU. When the fabric is dry (HU=0) the detector DNA is activated.

If the fabric is not delicate (SF=0) an AND gate 93 (which receives SF inverted by an inverter 96) validates a comparator 94, which compares the temperature $T_a$ programmed by the thermostat with the real temperature $T_v$ of the iron.

When $T_y \geq T_a$ this results in $S_y = 1$ on the output of the comparator 94 and the AND gate 93 activates the heating means 98.

When $T_y > T_a$ this results in $S_y = 0$ and the AND gate 93 deactivates the heating means 98.

A comparison of the temperature $T_s$ and the temperature $T_a$ is effected in the comparator 13. When $T_a < T_s$ the output S of the comparator 13 is in the 1 state (S=1). When $T_a \geq T_s$ the output S is in the 0 state (S=0). If the fabric is delicate (SF=1) the output of this comparator is applied to an AND gate 95, which also receives the signal SF=1. When the output of the gate 95 is 1 it activates the heating means 98. When the output of the gate 95 is 0 it deactivates the heating means 98 and activates the alarm 18.

When the fabric is moist (HU=1) the detector DNA is deactivated and the heating means are not affected by the actions controlled by the signal SF which have been described above. In fact, the heating means 98 can be operated to provide moderate heating under control of a comparator 97. This comparator receives the output of the gate 91, which detects turning on and use of the iron, and a set-point reference defining a moderate heating.

In the case of a moist fabric (HU=1) this moderate heating ensures drying of the fabric.

We claim:

1. An iron comprising a heating element, heating-control means for the heating element and a control thermostat characterised in that the iron comprises:

a fabric detector for detecting a type of fabric to be ironed, said fabric selector being selected from the group consisting of electrostatic and optical fabric detectors, said fabric detector being adapted to supply a signal (SF) to distinguish a delicate fabric (SF=1) from a non-delicate fabric (SF=0), means for storing a maximum temperature limit ($T_s$) corresponding to delicate fabrics, and comparison means for comparing the maximum temperature limit ($T_s$) with a temperature ($T_a$) programmed by means of the thermostat, when said signal (SF) indicates a non-delicate fabric (SF=0), the detector activating a control means to provide heating to the temperature ($T_a$), and, when said signal (SF) indicates a delicate fabric (SF=1), the detector validating the comparison means to act upon the control means either so as to activate an alarm when the programmed temperature is at least equal to the maximum temperature limit ($T_a \geq T_s$) and to inactivate the heating element or to allow heating only to a temperature not greater than the maximum temperature limit ($T_s$), or so as to enable heating to the programmed temperature ($T_a$) where the programmed temperature ($T_s$) is below the maximum temperature limit ($T_a < T_s$).

2. An iron as claimed in claim 1, characterised in that the detector is an electrostatic detector comprising:

means for sensing electrostatic charges produced at the fabric by the movement of the iron, and means for measuring an average amplitude of an electric signal resulting from electrostatic-charge variations.

3. An iron as claimed in claim 2, characterised in that it comprises an element made of a thermally insulating material and arranged on the iron to generate electrostatic charges by frictional contact as the iron moves on the fabric.

4. An iron as claimed in claim 3, characterised in that the thermal insulating element at least partly wholly surrounds the electrostatic detector.

5. An iron as claimed in claim 3, characterised in that the insulating material is Teflon, glass, enamel, or Kapton.

6. An iron as claimed in claim 2, characterised in that the detector is controlled by a fabric-humidity detector comprising:

means for measuring a resistivity of the fabric, and means for measuring an average amplitude of an electric signal resulting from resistivity variations caused by movement of the iron on the fabric.

7. An iron as claimed in claim 6, characterised in that the means for measuring the resistivity of the fabric comprise at least one electrode which is flush with a soleplate of the iron to enable it to be brought into contact with the fabric.

8. An iron as claimed in claim 1, characterised in that the detector is an optical detector comprising means for measuring a reflectance of the fabric.

9. An iron as claimed in claim 1 characterized in that the fabric detector is controlled by a state-of-use detector which state-of-use detector comprises means for supplying a signal (UT) to distinguish between use (UT=1) and non-use (UT=0) of the iron the fabric detector being activated when the signal (UT) indicates a state of use (UT=1) and being deactivated when the signal (UT) indicates a state of non-use (UT=0), the state-of-use detector activating the control means to turn off or reduce the heating when the signal (UT) indicates a state of non-use (UT=0).

10. An iron as claimed in claim 9 characterized in that the state-of-use detector is an electrostatic detector or a humidity detector, the iron further comprising means for detecting a movement of the iron by measuring a frequency of variations of said signal supplied from the state-of-use detector.

11. An iron as claimed in claim 3 wherein the insulating material is Teflon, glass enamel, or Kapton.

12. An iron as claimed in claim 4 wherein the insulating material is Teflon, glass enamel, or Kapton.

13. An iron as claimed in claim 3, wherein the fabric detector is controlled by a fabric-humidity detector comprising:

means for measuring a resistivity of the fabric, and means for measuring an average amplitude of an electric signal resulting from resistivity variations caused by the movement of the iron on the fabric.

14. An iron as claimed in claim 4, wherein the fabric detector is controlled by a fabric-humidity detector comprising:

means for measuring a resistivity of the fabric, and means for measuring an average amplitude of an electric signal resulting from resistivity variations caused by the movement of the iron on the fabric.

15. An iron as claimed in claim 5, wherein the fabric detector is controlled by a fabric-humidity detector comprising:

means for measuring a resistivity of the fabric, and means for measuring an average amplitude of an electric signal resulting from resistivity variations caused by the movement of the iron on the fabric.

16. An iron as claimed in claim 2, wherein the fabric detector is controlled by a state-of-use detector for the state of use of the iron, which state-of-use detector comprises means for supplying a signal (UT) to distinguish between use (UT=1) and non-use (UT=0), the fabric detector being activated when the signal (UT) indicates a state of use (UT=1) and being deactivated when the signal (UT) indicates a state of non-use (UT=0), the state-of-use detector activating control means to turn off or reduce the heating when the signal (UT) indicates a state of non-use (UT=0).

17. An iron as claimed in claim 3, wherein the fabric detector is controlled by a state-of-use detector for the state of use of the iron, which state-of-use detector comprises means for supplying a signal (UT) to distinguish between use (UT=1) and non-use (UT=0), the fabric detector being activated when the signal (UT) indicates a state of use (UT=1) and being deactivated when the signal (UT) indicates a state of non-use (UT=0), the state-of-use detector activating control means to turn off or reduce the heating when the signal (UT) indicates a state of non-use (UT=0).

18. An iron as claimed in claim 4, wherein the fabric detector is controlled by a state-of-use detector for the state of use of the iron, which state-of-use detector comprises means for supplying a signal (UT) to distinguish between use (UT=1) and non-use (UT=0), the fabric detector being activated when the signal (UT) indicates a state of use (UT=1) and being deactivated when the signal (UT) indicates a state of non-use (UT=0), the state-of-use detector activating control means to turn off or reduce the heating when the signal (UT) indicates a state of non-use (UT=0).

19. An iron as claimed in claim 5, wherein the fabric detector is controlled by a state-of-use detector for the state of use of the iron, which state-of-use detector comprises means for supplying a signal (UT) to distinguish between use (UT=1) and non-use (UT=0), the fabric detector being activated when the signal (UT) indicates a state of use (UT=1) and being deactivated when the signal (UT) indicates a state of non-use (UT=0), the state-of-use detector activating control means to turn off or reduce the heating when the signal (UT) indicates a state of non-use (UT=0).

20. An iron as claimed in claim 6, wherein the fabric detector is controlled by a state-of-use detector for the state of use of the iron, which state-of-use detector comprises means for supplying a signal (UT) to distinguish between use (UT=1) and non-use (UT=0), the fabric detector being activated when the signal (UT) indicates a state of use (UT=1) and being deactivated when the signal (UT) indicates a state of non-use (UT=0), the state-of-use detector activating control means to turn off or reduce the heating when the signal (UT) indicates a state of non-use (UT=0).

21. An iron as claimed in claim 7, wherein the fabric detector is controlled by a state-of-use detector for the state of use of the iron, which state-of-use detector comprises means for supplying a signal (UT) to distinguish between use (UT=1) and non-use (UT=0), the fabric detector being activated when the signal (UT) indicates a state of use (UT=1) and being deactivated when the signal (UT) indicates a state of non-use (UT=0), the state-of-use detector activating control means to turn off or reduce the heating when the signal (UT) indicates a state of non-use (UT=0).

22. An iron as claimed in claim 8, wherein the fabric detector is controlled by a state-of-use detector for the state of use of the iron, which state-of-use detector comprises means for supplying a signal (UT) to distinguish between use (UT=1) and non-use (UT=0), the fabric detector being activated when the signal (UT) indicates a state of use (UT=1) and being deactivated when the signal (UT) indicates a state of non-use (UT=0), the state-of-use detector activating control means to turn off or reduce the heating when the signal (UT) indicates a state of non-use (UT=0).

23. An iron as claimed in claim 9, wherein the state-of-use detector is a electrostatic detector or a humidity detector, the iron further comprising means for detecting a movement of the iron by measuring a frequency of variations of said electric signal supplied from the state-of-use detector.

* * * * *